US012593528B2

(12) United States Patent
Li et al.

(10) Patent No.: US 12,593,528 B2
(45) Date of Patent: Mar. 31, 2026

(54) SOLAR CELL AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Huimin Li, Haining (CN); Menglei Xu, Haining (CN); Jie Yang, Haining (CN); Xinyu Zhang, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 56 days.

(21) Appl. No.: 18/632,192

(22) Filed: Apr. 10, 2024

(65) Prior Publication Data

US 2025/0221088 A1      Jul. 3, 2025

(30) Foreign Application Priority Data

Dec. 28, 2023    (CN) .......................... 202311848785.3

(51) Int. Cl.
*H10F 77/30*        (2025.01)
*H10F 19/80*        (2025.01)
(Continued)

(52) U.S. Cl.
CPC ........... *H10F 77/219* (2025.01); *H10F 19/80* (2025.01); *H10F 77/315* (2025.01); *H10F 77/707* (2025.01)

(58) Field of Classification Search
CPC ..... H10F 77/211; H10F 77/215; H10F 77/219
See application file for complete search history.

(56) References Cited

U.S. PATENT DOCUMENTS

2014/0020752 A1    1/2014  Arimoto et al.
2015/0207003 A1*   7/2015  Woo ........................ H10F 19/80
                                                            136/246
(Continued)

FOREIGN PATENT DOCUMENTS

AU        2017221854 A1     9/2017
CN        103828069 B       10/2016
(Continued)

OTHER PUBLICATIONS

English machine translation of Harder (WO 2009/074468) published Jun. 18, 2009.*
(Continued)

*Primary Examiner* — Christina Chern
(74) *Attorney, Agent, or Firm* — USCH Law, PC

(57) ABSTRACT

A solar cell includes: a substrate having a front surface and a opposite rear surface; a first dielectric layer formed over the rear surface; a first doped conductive layer formed over a surface of the first dielectric layer away from the substrate; grooves arranged alternatingly in a first direction, penetrating the first doped conductive layer and the first dielectric layer, and extending into inside of the substrate; a second dielectric layer formed over a bottom surface of the grooves; a second doped conductive layer formed over a surface of the second dielectric layer away from the substrate; and a doped layer aligned with the second doped conductive layer and located between the second dielectric layer and the substrate. The first doped conductive layer and the doped layer are doped with a first dopant element, and the substrate and the second doped conductive layer are doped with a second dopant element.

20 Claims, 3 Drawing Sheets

(51) Int. Cl.
    *H10F 77/20*      (2025.01)
    *H10F 77/70*      (2025.01)

(56)         References Cited

U.S. PATENT DOCUMENTS

| | | | |
|---|---|---|---|
| 2016/0284896 A1 | 9/2016 | Westerberg et al. | |
| 2017/0288074 A1 | 10/2017 | Smith et al. | |
| 2019/0207041 A1 | 7/2019 | Rim et al. | |
| 2021/0175374 A1 | 6/2021 | Kim et al. | |
| 2022/0393052 A1 | 12/2022 | Qiu et al. | |
| 2023/0027079 A1* | 1/2023 | Chen .................... | H10F 10/146 |
| 2023/0369530 A1 | 11/2023 | Buchholz et al. | |

FOREIGN PATENT DOCUMENTS

| | | | | | |
|---|---|---|---|---|---|
| CN | 109545901 A | 3/2019 | | | |
| CN | 210778636 U | 6/2020 | | | |
| CN | 111952408 A | 11/2020 | | | |
| CN | 113299771 A | 8/2021 | | | |
| JP | 2014067803 A | 4/2014 | | | |
| JP | 6106403 B2 | 3/2017 | | | |
| KR | 20110020659 A | 3/2011 | | | |
| WO | WO-2009074468 A2 * | 6/2009 | .......... | H10F 71/121 | |
| WO | 2011105554 A1 | 9/2011 | | | |
| WO | WO-2013096500 A1 * | 6/2013 | .......... | H10F 71/121 | |
| WO | 2019181835 A1 | 9/2019 | | | |

OTHER PUBLICATIONS

Zhejiang Jinko Solar Co., Ltd. et al., Extended European Search Report, EP 24169521.2, Oct. 8, 2024, 16 pgs.

* cited by examiner

SOLAR CELL AND PHOTOVOLTAIC MODULE

CROSS REFERENCE TO RELATED APPLICATIONS

This application claims the benefit of priority under the Paris Convention to Chinese Patent Application No. CN202311848785.3, entitled "SOLAR CELL AND PHO-TOVOLTAIC MODULE," filed on Dec. 28, 2023, which is incorporated by reference herein in its entirety.

TECHNICAL FIELD

Embodiments of the present disclosure relate to the technical field of solar cells, in particular to a solar cell and a photovoltaic module.

BACKGROUND

Fossil energy has air pollution and limited reserve. Solar energy has advantages of clean, no pollution and rich resource. Therefore, the solar energy is gradually becoming core clean energy for replacing the fossil energy. Solar cells have a good photoelectric conversion efficiency, so the solar cells have become the focus of development of clean energy utilization.

In order to improve the efficiency of the solar cell and the utilization of incident light as much as possible, the Inter-digitated Back Contact (IBC) crystalline silicon photovol-taic cell came into being, electrodes of the IBC cell are arranged on a rear surface of the cell, so as to avoid light shielding caused by the arrangement of the electrode on a front surface of the cell. In this way, light absorption of the cell is significantly improved, thus the photoelectric conver-sion efficiency of the cell is improved.

SUMMARY

An embodiment of the present disclosure provides a solar cell. The solar cell includes a substrate having a front surface and a rear surface opposite to the front surface. The solar cell includes a first dielectric layer formed over the rear surface of the substrate, and a first doped conductive layer formed over a surface of the first dielectric layer away from the substrate. The first doped conductive layer is doped with a first dopant element, the substrate is doped with a second dopant element, one of the first dopant element and the second dopant element is a P-type dopant element and the other of the first dopant element and the second dopant element is an N-type dopant element. The solar cell includes a plurality of grooves disposed at intervals in a first direc-tion, penetrating the first doped conductive layer and the first dielectric layer, and extending into the substrate. The solar cell includes a second dielectric layer formed over a bottom surface of the plurality of grooves, and a second doped conductive layer formed over a surface of the second dielec-tric layer away from the substrate. The second doped con-ductive layer is doped with the second dopant element. The solar cell includes a doped layer aligned with the second doped conductive layer and located between the second dielectric layer and the substrate, and the doped layer is doped with the first dopant element.

In some embodiments, a ratio of a doping concentration of the first dopant element in the doped layer to a doping concentration of the first dopant element in the first doped conductive layer ranges from $1\times10^{-4}$ to $1\times10^{-3}$.

In some embodiments, the doping concentration of the first dopant element in the doped layer ranges from $1\times10^{14}/cm^3$ to $9\times10^{18}/cm^3$.

In some embodiments, in a direction perpendicular to the front surface of the substrate, a ratio of a thickness of the doped layer to a thickness of the substrate ranges from $5\times10^{-4}$ to $2\times10^{-3}$.

In some embodiments, in the direction perpendicular to the front surface of the substrate, the thickness of the doped layer ranges from 100 nm to 300 nm.

In some embodiments, in a direction perpendicular to the front surface of the substrate, an interval between a surface of the second doped conductive layer away from the sub-strate and a surface of the first doped conductive layer facing towards the substrate is less than or equal to 1 μm.

In some embodiments, in the direction perpendicular to the front surface of the substrate, the interval between the surface of the second doped conductive layer away from the substrate and the surface of the first doped conductive layer facing towards the substrate ranges from 50 nm to 300 nm.

In some embodiments, the solar cell further includes a passivation layer and multiple electrodes. The passivation layer is formed over a surface of the first doped conductive layer away from the substrate and a surface of the second doped conductive layer away from the substrate. The mul-tiple electrodes include first electrodes and second elec-trodes arranged alternatingly, the first electrodes penetrate the passivation layer and are in electrical contact with the first doped conductive layer, and the second electrodes penetrate the passivation layer and are in electrical contact with the second doped conductive layer.

In some embodiments, the solar cell further includes an antireflection layer formed over the front surface of the substrate.

In some embodiments, the antireflection layer has a textured surface away from the substrate.

In some embodiments, the antireflection layer has a textured surface in contact with the substrate.

In some embodiments, in the first direction, a ratio of a length of any portion of the second doped conductive layer to a length of any portion of the first doped conductive layer ranges from 0.2 to 1.

In some embodiments, in the first direction, the second doped conductive layer has a length in a range of 200 μm to 400 μm.

Accordingly, an embodiment of the present disclosure provides a photovoltaic module. The photovoltaic module includes: at least one cell string formed by connecting multiple solar cells described above; at least one encapsu-lation layer configured to cover surfaces of the at least one cell string; and at least one cover plate configured to cover surfaces of the at least one encapsulation layer away from the at least one cell string.

BRIEF DESCRIPTION OF THE DRAWINGS

One or more embodiments are described as examples with reference to the corresponding figures in the accompanying drawings, and the examples do not constitute a limitation to the embodiments. The figures in the accompanying draw-ings do not constitute a proportion limitation unless other-wise stated.

DETAILED DESCRIPTION OF THE EMBODIMENTS

Figure 1:
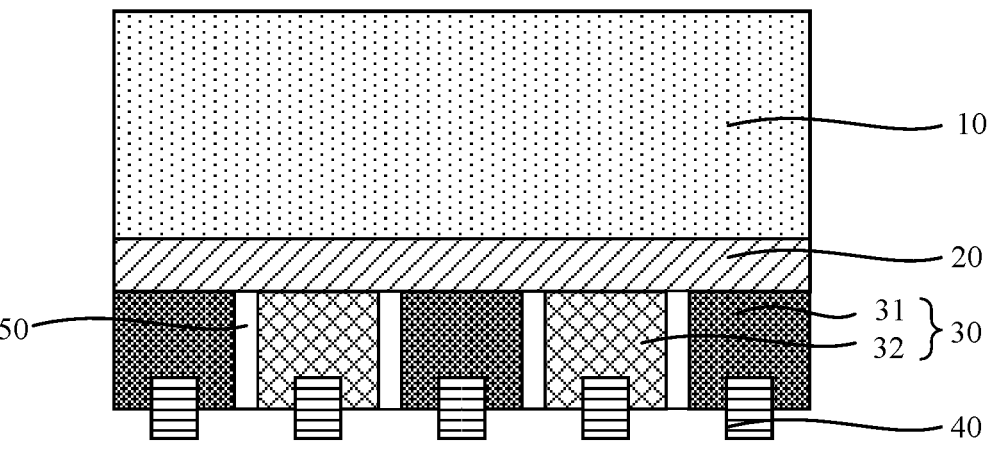
FIG. 1 is a schematic diagram of an overall structure of a solar cell according to an embodiment of the present dis-closure.

In some embodiments, referring to FIG. 1, the conventional IBC cell typically includes a substrate 10, a tunneling dielectric layer 20, a doped conductive layer 30, and multiple electrodes 40. The substrate 10 has a front surface and a rear surface opposite to the front surface. The tunneling dielectric layer 20 is formed over the rear surface of the substrate 10. The doped conductive layer 30 is formed over a surface of the tunneling dielectric layer 20 away from the substrate 10. The doped conductive layer 30 includes first doped regions 31 and second doped regions 32. The first doped regions 31 and the second doped regions 32 are doped with different types of dopants. Some of the multiple electrodes 40 are in electrical contact with the first doped regions 31, and remaining electrodes 40 are in electrical contact with the second doped regions 32. Electrodes in electrical contact with different doped regions are insulated with each other.

In a process of forming the IBC cell, all of the electrodes 40 are disposed on the rear surface of the substrate 10, no electrode is disposed on the front surface of the formed IBC cell, thus avoiding light shielding caused by the arrangement of the electrodes 40 on the front surface of the IBC cell and significantly increasing an actual light receiving area on the front surface of the IBC cell. The rear surface of the substrate 10 has a passivation contact structure formed by the tunneling dielectric layer 20 and the doped conductive layer 30, and carrier recombination loss on the rear surface of the substrate 10 is significantly reduced. In addition, the IBC cell has a greater light utilization rate, and the photoelectric conversion efficiency is significantly improved.

The IBC cell may also include isolating layers 50 penetrating the doped conductive layer 30. A respective isolating layer of the isolating layers 50 abuts against a respective first doped region 31 and a second doped region 32 adjacent to the respective first doped region 31, and the isolating layers 50 are configured to isolate the first doped regions 31 and the second doped regions 32 with different doping types. The isolating layers 50 may be an insulating dielectric layers formed by deposited insulating medium or grooves formed by patterned etching. FIG. 1 illustrates the isolating layers 50 only penetrating the doped conductive layer 30. In practice, the isolating layers 50 may extend to the inside of the tunneling dielectric layer 20, or even penetrate the tunneling dielectric layer 20, which is not limited in the embodiments of the present disclosure.

In addition, only part of the structure of the IBC cell is shown in part of drawings for the embodiments of the present disclosure, and the IBC cell may also include other film layers such as a passivation antireflection layer located on a surface of the doped conductive layer away from the substrate and/or a passivation antireflection layer located on the front surface of the substrate, which are not detailed here.

A solar cell is provided by an embodiment of the present disclosure. At the rear surface of the substrate, the solar cell is provided with a passivation contact structure formed by a first dielectric layer and a first doped conductive layer and a passivation contact structure formed by a second dielectric layer and a second doped conductive layer, so as to significantly reduce carrier recombination on the rear surface of the substrate, thus reducing a recombination current on the rear surface of the substrate. In this way, carrier recombination loss of the solar cell is reduced. The doped conductive layers include the first doped conductive layer and the second doped conductive layer with different doping types, so that all of the electrodes of the solar cell can be arranged on the rear surface of the solar cell, thereby significantly reducing the influence of the electrode, located on the front surface of the solar cell, on the light absorption of the cell, and improving the light absorption of the solar cell. The doped layer, with the doping type different from the doping types of the substrate and the second doped conductive layer, is arranged between the substrate and the second dielectric layer. An electric field is formed between the substrate and the doped layer and an electric field is formed between the doped layer and the second doped conductive layer, thereby improving an efficiency of a specific type of carriers in the substrate converging to a region aligned with the second doped conductive layer. In addition, a passivation effect of the substrate is improved and the open-circuit voltage of the solar cell is increased, the carrier recombination on the rear surface of the substrate is reduced, and the photoelectric conversion efficiency of the solar cell is significantly improved.

Embodiments of the present disclosure are described in detail in conjunction with the drawings. However, it should be understood by a person of ordinary skill in the art that in the various embodiments of the present disclosure, many technical details are given in order to give the reader a better understanding of the present disclosure. However, even without these technical details and various variations and modifications based on the following embodiments, it is possible to implement the technical solution sought to be protected in the present disclosure.

Figure 2:
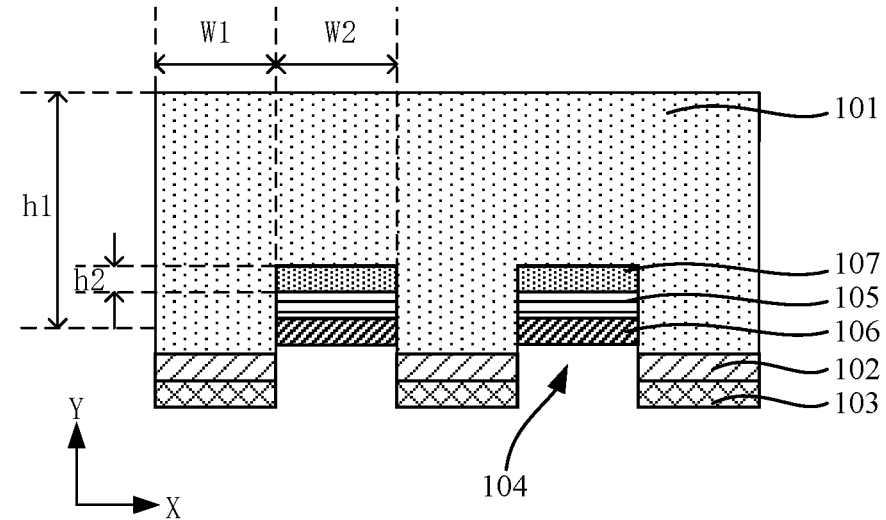
FIG. 2 is a schematic diagram of an overall structure of another solar cell according to an embodiment of the present disclosure.
Figure 3:
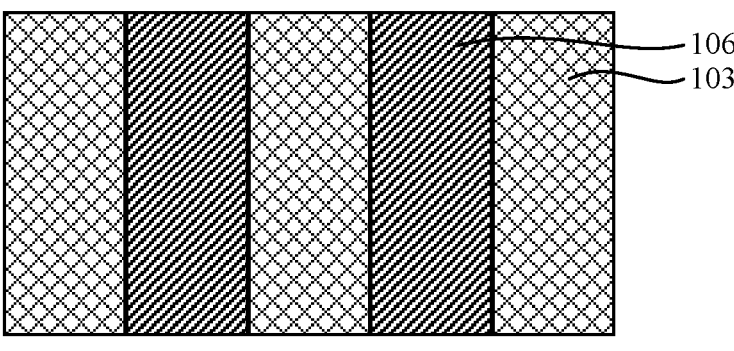
FIG. 3 is a top view of a tunneling layer according to an embodiment of the present disclosure.

An embodiment of the present disclosure provides a solar cell. Referring to FIG. 2 and FIG. 3, FIG. 2 is a schematic diagram of an overall structure of a solar cell, FIG. 3 is a top view of the solar cell. In the drawings, the X direction represents a first direction, and the Y direction represents a direction perpendicular to the front surface of the substrate 101.

The solar cell includes a substrate 101 having a front surface and a rear surface opposite to the front surface, and the substrate 101 is doped with a second dopant element. The solar cell includes a first dielectric layer 102 formed over the rear surface of the substrate 101, and a first doped conductive layer 103 formed over a surface of the first dielectric layer 102 away from the substrate 101. The first doped conductive layer 103 is doped with a first dopant element, one of the first dopant element and the second dopant element is a P-type dopant element and the other of the first dopant element and the second dopant element is an N-type dopant element. The solar cell includes multiple grooves 104 arranged at intervals in a first direction, penetrating the first doped conductive layer 103 and the first dielectric layer 102 and extending into the substrate 101. The solar cell includes a second dielectric layer 105 formed over bottom surfaces of the grooves 104 and a second doped conductive layer 106 formed over a surface of the second dielectric layer 105 away from the substrate 101. The second doped conductive layer 106 is doped with the second dopant element. The solar cell includes a doped layer 107 aligned with the second doped conductive layer 106, located between the second dielectric layer 105 and the substrate 101, and doped with the first dopant element.

In other words, the solar cell includes a substrate 101 having a front surface and a rear surface opposite to the front surface. The solar cell includes a first dielectric layer 102 formed over the rear surface of the substrate 101, and a first doped conductive layer 103 formed over a surface of the first dielectric layer 102 away from the substrate 101. The first doped conductive layer 103 is doped with a first dopant element, the substrate is doped with a second dopant element, one of the first dopant element and the second dopant element is a P-type dopant element and the other of the first dopant element and the second dopant element is an N-type dopant element. The solar cell includes a plurality of grooves 104 arranged at intervals in a first direction, penetrating the first doped conductive layer 103 and the first dielectric layer 102 and extending into the substrate 101. The solar cell includes a second dielectric layer 105 having a plurality of portions formed in respective grooves of the plurality of grooves 104 and a second doped conductive layer 106 having a plurality of portions formed in respective grooves of the plurality of grooves, a respective portion of the second doped conductive layer in a respective groove being formed over a respective portion of the second dielectric layer 105 in the respective groove, on a side of the respective portion of the second dielectric layer away from the substrate 101. The second doped conductive layer 106 is doped with the second dopant element. The solar cell includes a doped layer 107 having a plurality of portions, a respective portion of the doped layer 107 is aligned with the respective portion of the second doped conductive layer 106, and located on a side of the respective portion of the second dielectric layer 105 facing a bottom of the respective groove, and the doped layer 107 is doped with the first dopant element.

In FIG. 3, as an example, the number of the grooves 104 is 2, and a length direction of each of the first doped conductive layer 103, the second doped conductive layer 106, the groove 104, the first dielectric layer 102, the second dielectric layer 105 and the doped layer 107 is perpendicular to the first direction. In practice, the number of the grooves 104 may also be 3 or more, an included angle between the length direction of each film layer and the first direction may also be set to other angles, such as 30°, 45°, 60° or 75°.

In FIG. 2, as an example, the first dielectric layer 102 is not in contact with the second doped conductive layer 106 in the groove 104, and a top surface of the first dielectric layer 102 facing toward the substrate 101 is lower than a bottom surface of the second doped conductive layer 106 away from the substrate 101. In practice, the top surface of the first dielectric layer 102 facing toward the substrate 101 may be level with the bottom surface of the second doped conductive layer 106 away from the substrate 101, or the top surface of the first dielectric layer 102 facing toward the substrate 101 may be higher than the bottom surface of the second doped conductive layer 106 away from the substrate 101, as long as it is ensured that a bottom surface of the first doped conductive layer 103 facing toward the substrate 101 is farther away from the substrate than the bottom surface of the second doped conductive layer 106 away from the substrate 101, that is, the first doped conductive layer 103 is not in contact with the second doped conductive layer 106.

In addition, the doped layer 107 and the second dielectric layer 105 may have the same length and width as the second doped conductive layer 106, or a length tolerance and a width tolerance among the doped layer 107, the second dielectric layer 105 and the second doped conductive layer 106 may be less than a preset value, for example, 2%, 5% or 10% or the like. The first dielectric layer 102 may have the same length and width as the first doped conductive layer 103, or a length tolerance and a width tolerance between the first dielectric layer 102 and the first doped conductive layer 103 may be less than a preset value, for example, 2%, 5% or 10% or the like.

At the rear surface of the substrate 101, the solar cell is provided with a passivation contact structure formed by the first dielectric layer 102 and the first doped conductive layer 103 and a passivation contact structure formed by the second dielectric layer 105 and the second doped conductive layer 106. The passivation contact structure can apply good passivation to the substrate 101, so that the open-circuit voltage of the solar cell can be increased, and the carrier recombination on the rear surface of the substrate 101 can be reduced, thereby reducing the carrier recombination loss of the solar cell. The doped conductive layers include the first doped conductive layer 103 and the second doped conductive layer 106 with different doping types, so that all of the electrodes of the solar cell can be arranged on the rear surface of the solar cell, the light shielding effect caused by the arrangement of the electrodes on the front surface of the solar cell is avoided, and the light absorption of the solar cell is improved. The front surface of the solar cell refers to the surface of the solar cell which receives a greater intensity of incident light, and the rear surface of the solar cell refers to the surface of the solar cell which receives a less intensity of incident light.

The doped layer 107 is arranged between the second dielectric layer 105 and the substrate 101 and is arranged to be aligned with the second doped conductive layer 106. The doped layer 107 is doped with a doping type different from the doping types of the substrate 101 and the second doped conductive layer 106. The electric field formed between the doped layer 107 and the substrate 101 can improve an efficiency of a specific polarity of carriers converging to a region in the substrate 101 which is aligned with the second doped conductive layer 106, thereby reducing the carrier converging loss of the solar cell. The electric field formed between the doped layer 107 and the second doped conductive layer 106 can improve a passivation effect of the substrate 101, increase the open-circuit voltage of the solar cell, reduce the carrier recombination loss on the rear surface of the substrate 101, and improve the photoelectric conversion efficiency of the solar cell.

In some embodiments, the substrate 101 may be a P-type semiconductor substrate or an N-type semiconductor substrate. One of the first dopant element and the second dopant element is a P-type dopant element and the other of the first dopant element and the second dopant element is an N-type dopant element. The second doped conductive layer 106 is doped with the same doping type as the substrate 101. Moreover, a doping concentration of the second dopant element in the second doped conductive layer 106 is higher than a doping concentration of the second dopant element in the substrate 101, where the doping concentration may be represented by an atomic percentage of the dopant element in the film layer.

The N-type semiconductor substrate is doped with N-type dopant elements, and the N-type dopant element may be any one of group-V elements such as phosphorus (P) element, bismuth (Bi) element, antimony (Sb) element or arsenic (As) element. The P-type semiconductor substrate is doped with P-type dopant elements, and the P-type dopant element may be any one of group-III elements such as boron (B) element, aluminum (Al) element, gallium (Ga) element or indium (In) element.

In some embodiments, the substrate 101 may be made of an elemental semiconductor material consisting of a single element, such as silicon or germanium. The elemental semiconductor material may be of a monocrystalline state, a polycrystalline state, an amorphous state or a microcrystalline state (having both the monocrystalline state and the amorphous state). For example, silicon may be at least one of monocrystalline silicon, polycrystalline silicon, amorphous silicon or microcrystalline silicon.

In some embodiments, the substrate 101 may be made of compound semiconductor material. Common compound semiconductor materials include, but are not limited to, silicon germanide, silicon carbide, gallium arsenide, indium gallium, perovskite, cadmium telluride, or copper indium selenium. The substrate 101 may also be a sapphire substrate, a silicon substrate on an insulator, or a germanium substrate on an insulator.

In some embodiments, the first dielectric layer 102 may be made of at least one of silicon oxide, silicon nitride, silicon oxynitride, silicon carbide or magnesium fluoride. The second dielectric layer 105 may be made of at least one of silicon oxide, silicon nitride, silicon oxynitride, silicon carbide or magnesium fluoride.

In some embodiments, the first doped conductive layer 103 may be made of at least one of nanocrystalline silicon, polycrystalline silicon, microcrystalline silicon, amorphous silicon, silicon carbide or titanium nitride or the like. The second doped conductive layer 106 may be made of at least one of nanocrystalline silicon, polycrystalline silicon, microcrystalline silicon, amorphous silicon, silicon carbide or titanium nitride or the like.

In some embodiments, the material of the doped layer 107 may be similar to the material of the substrate 101 and may be at least one of monocrystalline silicon, polycrystalline silicon, amorphous silicon or microcrystalline silicon, and may also be a compound semiconductor material.

In some embodiments, a ratio of a doping concentration of the first dopant element in the doped layer 107 to a doping concentration of the first dopant element in the first doped conductive layer 103 ranges from $1\times10^{-4}$ to $1\times10^{-3}$.

Referring to the above analysis and description for the doped layer 107, on the one hand, the electric field is formed between the doped layer 107 and the substrate 101 with the doping type different from the doping type of the doped layer 107, the efficiency of the specific type of carriers converging to the region in the substrate 101 which is aligned with the second doped conductive layer 106 is improved, the carrier converging loss of the region in the substrate 101 which is aligned with the second doped conductive layer 106 is reduced. On the other hand, the electric field is formed between the doped layer 107 and the second doped conductive layer 106 with the doping type different from the doping type of the doped layer 107, the passivation effect of the rear surface of the substrate 101 is improved, the open-circuit voltage of the solar cell is increased, the carrier recombination loss of the solar cell is reduced.

In a case that the doping concentration of the first dopant element in the doped layer 107 is too high, an electron hole recombination effect of the carrier in the doped layer 107 may be significantly improved during the transmission of the carrier to the second doped conductive layer 106 through the doped layer 107, thus resulting in a case that the impact of the carrier recombination loss in the doped layer 107 on the photoelectric conversion efficiency of the solar cell is higher than the impact of reduction in the carrier recombination loss of the substrate 101 on the photoelectric conversion efficiency of the solar cell, therefore, the photoelectric conversion efficiency of the solar cell is reduced.

In a case that the doping concentration of the first dopant element in the doped layer 107 is too low, a strength of the electric field formed between the substrate 101 and the doped layer 107 and a strength of the electric field formed between the doped layer 107 and the second doped conductive layer 106 may be insufficient, the improvement on the passivation effect is limited, and a transverse transmission ability of the carrier in the doped layer 107 is poor. The efficiency of the carrier converging to the second doped conductive layer 106 is low.

Therefore, the ratio of the doping concentration of the first dopant element in the doped layer 107 to the doping concentration of the first dopant element in the first doped conductive layer 103 may be set in a range from $1\times10^{-4}$ to $1\times10^{-3}$, for example, $1.1\times10^{-4}$, $1.2\times10^{-4}$, $1.5\times10^{-4}$, $2\times10^{-4}$, $3\times10^{-4}$, $5\times10^{-4}$, $7.5\times10^{-4}$, $9.5\times10^{-4}$, etc. It is ensured that the carrier has a good transverse transmission ability in the doped layer 107, thereby reducing the carrier converging loss of the solar cell, and improving effectively the passivation effect and increasing the open-circuit voltage of the solar cell, reducing the overall carrier recombination effect of the solar cell, and then effectively improving the photoelectric conversion efficiency of the solar cell.

In some embodiments, the doping concentration of the first dopant element in the doped layer 107 ranges from $1\times10^{14}/cm^3$ to $9\times10^{18}/cm^3$.

Referring to the above analysis and description for the doping concentration of the first dopant element in the doping layer 107, the doping concentration of the first dopant element in the doping layer 107 may affect the overall passivation effect and the carrier converging loss of the solar cell. In the first doped conductive layer 103, the doping concentration of the first dopant element is usually in a range from $1\times10^{20}$ to $6\times10^{20}$. Therefore, in the process of setting the doped layer 107, the doping concentration of the first dopant element in the doped layer 107 may be set in a range from $1\times10^{14}/cm^3$ to $9\times10^{18}/cm^3$, for example, $2\times10^{14}/cm^3$, $5\times10^{14}/cm^3$, $8\times10^{14}/cm^3$, $1.25\times10^{15}/cm^3$, $2.5\times10^{15}/cm^3$, $5\times10^{15}/cm^3$, $1\times10^{16}/cm^3$, $2.5\times10^{16}/cm^3$, $5\times10^{16}/cm^3$, $1\times10^{17}/cm^3$, $2\times10^{17}/cm^3$, $3.5\times10^{17}/cm^3$, $5\times10^{17}/cm^3$, $1\times10^{18}/cm^3$, $4\times10^{18}/cm^3$, $8\times10^{18}/cm^3$, or the like. The doping concentration of the first dopant element in the doped layer 107 is set within an appropriate range to improve the efficiency of the specific polarity of carriers converging to a region in the substrate 101 which is aligned with the second doped conductive layer 106, improve the passivation effect of the solar cell and increase the open-circuit voltage of the solar cell, thereby reducing the overall carrier recombination loss of the solar cell and improving the photoelectric conversion efficiency of the solar cell.

In some embodiments, in a direction perpendicular to the front surface of the substrate 101, a ratio of a thickness of the doped layer 107 to a thickness of the substrate 101 ranges from $5 \times 10^{-4}$ to $2 \times 10^{-3}$.

The thickness of the substrate 101 in the direction perpendicular to the front surface of the substrate 101 refers to an average interval h1 between the front surface and the rear surface of the substrate 101 which are opposite to each other. The thickness of the doped layer 107 in the direction perpendicular to the front surface of the substrate 101 refers to an average interval h2 between the surface of the doped layer 107 in contact with the substrate 101 and the surface of the doped layer 107 in contact with the second dielectric layer 105. Due to selective etching on the rear surface of the substrate 101, the thickness h1 in FIG. 2 is not represented by the maximum interval between the front surface of the substrate 101 and the rear surface of the substrate 101.

The main function of the doped layer 107 is serving as a new passivation film to improve the overall passivation effect of the solar cell and further improve the photoelectric conversion efficiency of the solar cell. Under the condition that the overall thickness of the solar cell is fixed, in order to ensure that the first doped conductive layer 103 and the second doped conductive layer 106 are separated from each other, a greater thickness of the doped layer 107 results in a greater distance of the groove extending into the inside of the substrate 101, and the thickness of the part of the substrate 101 aligned with the second doped conductive layer 106 is correspondingly reduced. As a result, the ability of the solar cell absorbing the energy in the incident light to generate the photo-generated carrier declines significantly, thereby affecting the photoelectric conversion efficiency of the solar cell.

In addition, the passivation effect improved by the doped layer 107 is mainly caused by the electric field formed between the doped layer 107 and the substrate 101 and the electric field formed between the doped layer 107 and the second doped conductive layer 106. In a case that the thickness of the doped layer 107 is too small, the formed electric field is prone to the problem of too low electric field strength. In addition, in the process of forming the second dielectric layer 105, the doped layer 107 is prone to excessive damage, which results in obvious damage in the performance of the doped layer 107, and the electric field cannot be effectively formed.

When arranging the doped layer 107, the ratio of the thickness of the doped layer 107 in the direction perpendicular to the front surface of the substrate 101 to the thickness of the substrate 101 in the direction perpendicular to the front surface of the substrate 101 may be set in a range from $5 \times 10^{-4}$ to $2 \times 10^{-3}$, for example, $6 \times 10^{4}$, $7 \times 10^{4}$, $8.5 \times 10^{4}$, $1 \times 10^{-3}$, $1.25 \times 10^{-3}$, $1.5 \times 10^{-3}$, or $1.8 \times 10^{-3}$. The substrate 101 of the solar cell has a sufficient thickness to ensure that the solar cell has good photo-generated carrier generation ability, an electric field with a good passivation effect is formed between the doped layer 107 and the substrate 101 and between the doped layer 107 and the second doped conductive layer 106, so that the passivation effect of the solar cell is effectively improved, the open-circuit voltage of the solar cell is increased and the photoelectric conversion efficiency of solar cell is improved.

In addition, the substrate 101 is provided with multiple grooves 104 at the rear surface of the substrate 101, and the thicknesses of the doped layers 107 located in different grooves 104 in the direction perpendicular to the front surface of the substrate 101 may be same or different, which is not limited in the embodiments of the present disclosure.

In some embodiments, in the direction perpendicular to the front surface of the substrate 101, the thickness of the doped layer 107 ranges from 100 nm to 300 nm.

Referring to the above analysis and description for the doped layer 107, the thickness of the substrate 101 is usually in a range from 140 μm to 180 μm, therefore the thickness of the doped layer 107 may be set in a range from 100 nm to 300 nm, for example, 110 nm, 120 nm, 135 nm, 150 nm, 175 nm, 200 nm, 230 nm, 275 nm, or the like. The effect of the doped layer 107 on the photo-generated carrier generation ability of the solar cell is small, and the doped layer 107 can effectively improve the passivation effect of the solar cell, reduce the carrier recombination loss of the solar cell, increase the open-circuit voltage and improve the photoelectric conversion efficiency.

It should be noted that, in the process of forming the structure on the rear surface of the substrate 101 in the solar cell preparation process, the first dielectric layer 102 may be firstly formed on the rear surface of the substrate 101 by the way of full-plane deposition, and the first doped conductive layer 103 may be formed on the surface of the first dielectric layer 102 away from the substrate 101 by the process of full-plane deposition and doping. After forming the first dielectric layer 102 and the first doped conductive layer 103 in this way, the first doped atom in the first doped conductive layer 103 diffuses from the rear surface of the substrate 101 to the inside of the substrate 101. Then, the grooves 104 are formed by performing selective etching from the surface of the first doped conductive layer 103 away from the substrate 101 to the inside of the substrate 101 along the direction perpendicular to the front surface of the substrate 101. The grooves 104 penetrate through the first doped conductive layer 103 and the first dielectric layer 102, and extend a certain distance to the inside of the substrate 101. Then, the doped layer 107, the second dielectric layer 105 and the second doped conductive layer 106 are formed based on the grooves 104.

Figure 4:
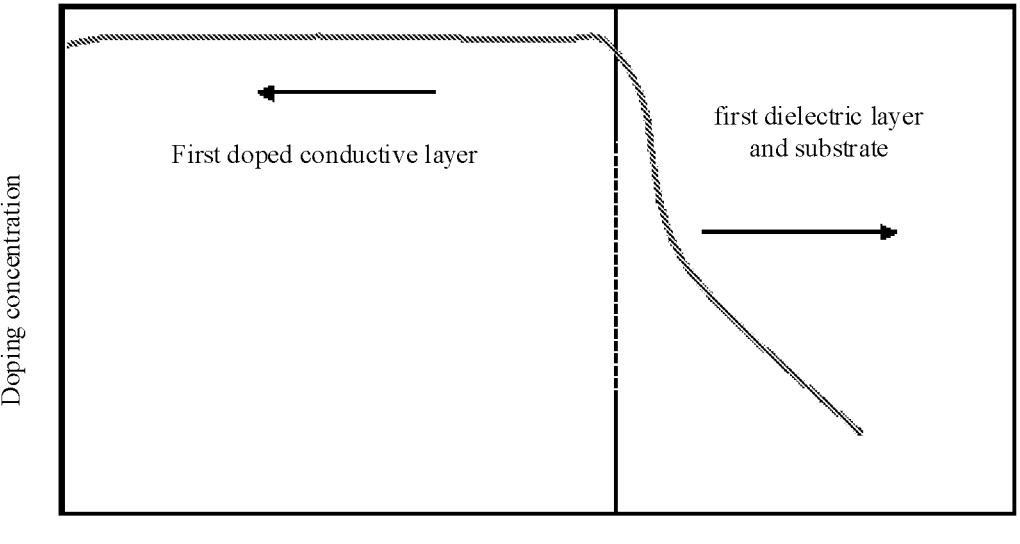
FIG. 4 is a schematic diagram of a doping concentration of a first doping atom according to an embodiment of the present disclosure.

Referring to FIG. 4, FIG. 4 is a schematic diagram of a doping concentration of a first doping atom. The dashed line represents the etching depth of the substrate 101 when forming the grooves 104 by performing etching. Based on the principle of atomic diffusion, the doping concentration of the first doped atom in the substrate 101 and the first doped conductive layer 103 on the rear surface of the substrate 101 is shown in FIG. 4. In other words, the doping concentration of the first doped atom in the substrate 101 gradually decreases in a direction from the rear surface of the substrate 101 to the front surface of the substrate 101. The maximum doping concentration of the first doped atom in the substrate 101 is approximately equal to the doping concentration of the first doped atom in the first doped conductive layer 103. It is found by measurement that, in the direction perpendicular to the front surface of the substrate 101, after performing etching of 1 μm from the rear surface of the substrate 101 to the inside of the substrate 101, the doping concentration of the first doping atom on the exposed surface of the substrate 101 is lower than a doping concentration standard of the first doping atom in the doped layer 107. That is to say, when the etching depth is less than 1 μm, for example, the etching depth is 975 nm, 925 nm, 875 nm, 780 nm, 640 nm, 500 nm, 350 nm, 300 nm, 275 nm, 230 nm, 175 nm, 75 nm, 50 nm or 25 nm, the doping concentration of the first doping atom on the exposed surface of the substrate 101 is higher than the doping concentration standard of the first doping atom in the doped layer 107, the substrate 101 includes a part which can act as the doped layer 107.

Therefore, referring to the schematic diagram of change in the doping concentration of the first dopant atom in the substrate 101 and the requirements for the thickness of the doped layer 107 and the doping concentration of the first dopant atom in the solar cell, in the solar cell preparation process, the etching depth of the substrate 101 may be controlled when forming the grooves 104, so that in the substrate 101 aligned with the bottom surface of the grooves 104, a region, with a thickness in a range from 100 nm to 300 nm and a doping concentration of the first doped atom in a range from $1 \times 10^{14}/cm^3$ to $9 \times 10^{18}/cm^3$, is formed and this region in the substrate 101 is directly used as the doped layer 107. Then, the second dielectric layer 105 is directly formed on the bottom surface of the grooves 104 by the selective deposition process, and the second doped conductive layer 106 is formed on the surface of the second dielectric layer 105 away from the substrate 101 by the selective deposition process and the doping process.

By adjusting the etching process and the doping process during the formation of the first doped conductive layer 103, the solar cell can directly use a partial thickness of the substrate 101 as the doped layer 107, there is no need to prepare the doped layer 107 with special deposition and doping processes, thereby reducing the process steps and a process difficulty in the solar cell preparation process.

In addition, the substrate 101 may be directly etched to a greater depth, and the doped layer 107 is formed on the bottom surface of the grooves 104 by the deposition process and the doping process, and then the second dielectric layer 105 and the second doped conductive layer 106 are formed in turn.

In some embodiments, in a direction perpendicular to the front surface of the substrate 101, an interval between a surface of the second doped conductive layer 106 away from the substrate 101 and a surface of the first doped conductive layer 103 facing towards the substrate 101 is less than or equal to 1 μm.

In the process of forming the solar cell, the first doped conductive layer 103 and the second doped conductive layer 106 have different doping types, and the majority carriers in the first doped conductive layer 103 and the majority carriers in the second doped conductive layer 106 have different polarities. Therefore, in a case that the first doped conductive layer 103 and the second doped conductive layer 106 are in contact, recombination may occur between majority carriers with different polarities, which reduces the lifetime of majority carriers and the photoelectric conversion efficiency of the solar cell.

Therefore, in the solar cell preparation process, an initial dielectric layer covering the rear surface of the substrate 101 may be formed on the rear surface of the substrate 101, and an initial doped conductive layer covering a surface of the initial dielectric layer away from the substrate 101 may formed, and then the initial doped conductive layer, the initial dielectric layer and the substrate 101 may be etched through patterned processing, to form multiple grooves 104. The initial dielectric layer and the initial doped conductive layer are converted into the first dielectric layer 102 and the first doped conductive layer 103, respectively. Then, the doped layer 107, the second dielectric layer 105 and the second doped conductive layer 106 are formed successively on the bottom surfaces of the grooves 104, so that the top surface of the first doped conductive layer 103 facing toward the substrate 101 is lower than the bottom surface of the second doped conductive layer 106 away from the substrate 101, and there is a certain interval between the top surface of the first doped conductive layer 103 facing toward the substrate 101 and the bottom surface of the second doped conductive layer 106 away from the substrate 101.

It is apparent that, the doped layer 107, the second dielectric layer 105 and the second doped conductive layer 106 are all formed on the basis of the grooves 104 formed by etching the substrate 101. A greater depth of the grooves 104 extending to the inside of the substrate 101 results in a greater interval between the bottom of the second doped conductive layer 106 away from the substrate 101 and the top surface of the first doped conductive layer 103 facing towards the substrate 101 in the direction perpendicular to the front surface of the substrate 101, and results in a greater damage to the substrate 101. In addition, in the process of forming electrodes located on the first doped conductive layer 103 and the second doped conductive layer 106, the difficulty of uniform printing of electrode paste is also increased.

Therefore, the interval between the bottom surface of the second doped conductive layer 106 away from the substrate 101 and the top surface of the first doped conductive layer 103 facing towards the substrate 101 in the direction perpendicular to the front surface of the substrate 101 may be set to be less than or equal to 1 μm, for example, 950 nm, 900 nm, 850 nm, 750 nm, 650 nm, 500 nm, 350 nm, 300 nm, 200 nm, 125 nm, 75 nm, 50 nm or 25 nm or the like. In this way, the first doped conductive layer 103 and the second doped conductive layer 106 are not in contact with each other, so as to ensure that the majority carriers with different polarities have a long service life, and reduce the difficulty of patterned etching on the initial film layer on the rear surface of the substrate 101 and the difficulty of simultaneous electrode preparation on the first doped conductive layer 103 and the second doped conductive layer 106, and control the damage to the photo-generated carrier generation capacity of the substrate 101 within a small range.

In some embodiments, in the direction perpendicular to the front surface of the substrate 101, the interval between the surface of the second doped conductive layer 106 away from the substrate 101 and the surface of the first doped conductive layer 103 facing towards the substrate 101 ranges from 50 nm to 300 nm.

Referring to the above description and analysis for the doped layer 107 and the second doped conductive layer 106, the doped layer 107 needs to have a sufficient thickness and a sufficient doping concentration of the first doping element to effectively improve the passivation effect of the solar cell. The bottom surface of the second doped conductive layer 106 away from the substrate 101 needs to be higher than the top surface of the first doped conductive layer 103 facing towards the substrate 101, to ensure that the first doped conductive layer 103 and the second doped conductive layer 106 do not directly contact each other.

In the process of preparing the doped layer 107, the second doped conductive layer 106 and the second dielectric layer 105, the grooves 104 may be firstly formed by patterned etching the initial dielectric layer, the initial doped conductive layer and the substrate 101, and then each film layer is prepared successively on the bottom surface of grooves 104. Due to the diffusion of the first dopant element, in the process of forming the initial doped conductive layer, the first dopant element in the initial doped conductive layer may diffuse from the rear surface of the substrate 101 to the inside of the substrate 101. In the direction perpendicular to the front surface of the substrate 101, the doping concentration of the first dopant element decreases with the increase of the interval between the current position and the rear surface of the substrate 101.

In the process of forming the solar cell, in the case of a certain film thickness, the interval between the surface of the first doped conductive layer 103 facing towards the substrate 101 and the surface of the second doped conductive layer 106 away from the substrate 101 may reflect the distance that the grooves 104 extends into the inside of the substrate 101 during the formation of the grooves 104. A greater interval between the surface of the first doped conductive layer 103 facing towards the substrate 101 and the surface of the second doped conductive layer 106 away from the substrate 101 means a greater depth that the grooves 104 extend into the inside of the substrate 101 and a lower concentration of the first dopant element in the part of the substrate 101 aligned with the bottom surface of the grooves 104 after the grooves 104 are formed. In this case, the doping concentration of the first dopant element in the part, doped with the first dopant element, in the substrate 101 cannot meet the requirements of acting as the doped layer 107. The doped layer 107 needs to be formed on the bottom surface of the grooves 104 through the deposition and doping processes. The preparation process of the solar cell is relatively complicated.

However, a less interval between the surface of the first doped conductive layer 103 facing towards the substrate 101 and the surface of the second doped conductive layer 106 away from the substrate 101 means a less depth that the groove 104 extends into the inside of the substrate 101 and a greater concentration of the first dopant element in the part of the substrate 101 aligned with the bottom surface of the groove 104, which meets the requirements of acting as the doped layer 107. In this case, the part of the substrate 101, which is aligned with the second doped conductive layer 106 and is adjacent to the bottom surface of the groove 104, may be directly used as the doped layer 107, and then the second dielectric layer 105 and the second doped conductive layer 106 are successively formed on the bottom surface of the groove 104.

Therefore, in the direction perpendicular to the front surface of the substrate 101, the interval between the surface of the second doped conductive layer 106 away from the substrate 101 and the surface of the first doped conductive layer 103 facing towards the substrate 101 may be set in a range from 50 nm to 300 nm, for example, 52.5 nm, 55 nm, 60 nm, 65 nm, 75 nm, 85 nm, 100 nm, 120 nm, 150 nm, 180 nm, 225 nm, 275 nm, or the like. In this way, the distance that the groove 104 extends into the inside of the substrate 101 is controlled within an appropriate range, so that the part of the substrate 101, which is aligned with the second doped conductive layer 106 and is adjacent to the bottom surface of the groove 104, can be directly used as the doped layer 107, the preparation of the doped layer 107 does not need additional deposition and doping processes, thereby reducing the process steps in the solar cell preparation process and reducing the interval between the surface of the first doped conductive layer 103 away from the substrate 101 and the surface of the second doped conductive layer 106 away from the substrate 101, so as to facilitate the uniform preparation of electrodes.

In some embodiments, in the first direction, a ratio of a length of any portion of the second doped conductive layer 106 to a length of any portion of the first doped conductive layer 103 ranges from 0.2 to 1.

In the first direction, the length of the second doped conductive layer 106 refers to the interval W2 between two opposite ends of the second doped conductive layer 106 in the first direction, and the length of the first doped conductive layer 103 refers to the interval W1 between two opposite ends of the first doped conductive layer 103 in the first direction.

In the process of arranging the first doped conductive layer 103 and the second doped conductive layer 106 on the rear surface of the substrate 101, in general, in order to obtain a good collection of carriers of different polarities, any first doped conductive layer 103 and any second doped conductive layer 106 are usually equal in length in the first direction.

Considering that the doped layer 107 is subsequently formed on the region on the rear surface of the substrate 101 which is aligned with the second doped conductive layer 106 and the doped layer 107 can improve the efficiency of carriers with a specific polarity converging to the rear surface of the substrate 101 which is aligned with the second doped conductive layer 106, under the condition of equal number of holes and electrons, the length of the second doped conductive layer 106 in the first direction may be reduced. Therefore, in the first direction, the ratio of the length of the second doped conductive layer 106 to the length of the first doped conductive layer 103 may be set in a range from 0.2 to 1, for example, 0.25, 0.3, 0.35, 0.5, 0.75, 0.9 or the like. By setting the ratio between the two lengths in the first direction within an appropriate range, the carrier collection ability of each of the first doped conductive layer 103 and the second doped conductive layer 106 is improved, and the region in the rear surface of the substrate 101 is effectively utilized to further improve the photoelectric conversion efficiency of the solar cell.

It should be understood that, in FIG. 2, as an example, the first doped conductive layers 103 have a same length in the first direction, and the second doped conductive layers 106 have a same length in the first direction. The lengths of the first doped conductive layers 103 in the first direction may be the same or different, and the lengths of the second doped conductive layers 106 in the first direction may be the same or different, as long as the average length of the second doped conductive layers 106 in the first direction and the average length of the first doped conductive layers 103 in the first direction are within the above ratio range.

In some embodiments, in the first direction, the length of the second doped conductive layer ranges from 200 μm to 400 μm. Referring to the above description and analysis for the setting of the length of the second doped conductive layer 106, based on an electrode density of the rear surface of the solar cell, the length of the second doped conductive layer 106 in the first direction may be set in the range from 200 μm to 400 μm, for example, 210 μm, 220 μm, 240 μm, 260 μm, 300 μm, 350 μm, 380 μm or the like. It is ensured that the second doped conductive layer 106 can have a high collection efficiency for a specific polarity of carriers, thereby improving the utilization rate of the substrate 101, thus improving the photoelectric conversion efficiency of the solar cell.

It should be noted that, there are multiple first doped conductive layers 103 and second doped conductive layers 106 on the rear surface of substrate 101, the lengths of the first doped conductive layers 103 in the first direction may be the same or different, and the lengths of the second doped conductive layers 106 in the first direction may be the same or different, which is not limited in the embodiments of the present disclosure.

Figure 5:
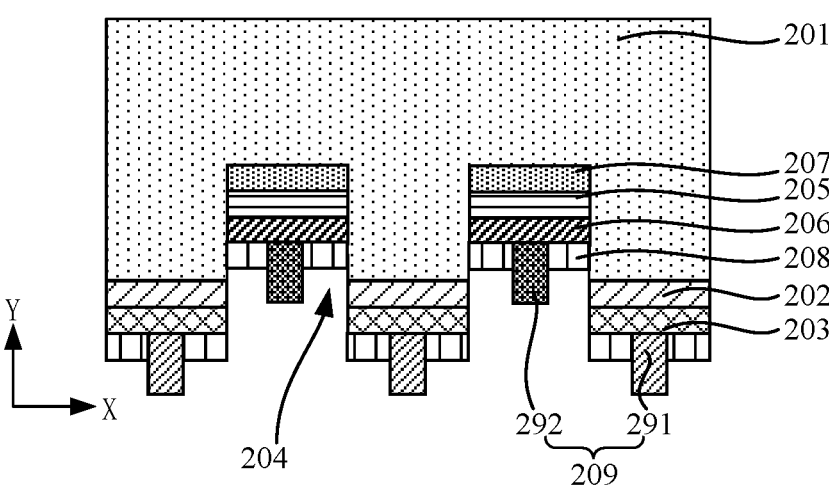
FIG. 5 is a schematic diagram of an overall structure of a further solar cell according to an embodiment of the present disclosure.

With reference to FIG. 2 and FIG. 5, FIG. 5 is a schematic structural diagram of a solar cell. The X direction represents the first direction, and the Y direction represents the direction perpendicular to the front surface of the substrate 201.

In some embodiments, the solar cell further includes a passivation layer 208 and multiple electrodes 209. The passivation layer 208 is located on a surface of the first doped conductive layer 203 away from the substrate 201 and a surface of the second doped conductive layer 206 away from the substrate 201. The multiple electrodes 209 include first electrodes 291 and second electrodes 292 arranged alternatingly. The first electrodes 291 penetrate the passivation layer 208 and are in electrical contact with the first doped conductive layer 203, and the second electrodes 292 penetrate the passivation layer 208 and are in electrical contact with the second doped conductive layer 206.

In order to further improve the light absorption and the passivation effect of the solar cell, the passivation layer 208 may be formed on the rear surface of the solar cell, and the passivation layer 208 is used to cover the surface of the first doped conductive layer 203 away from the substrate 201 and the surface of the second doped conductive layer 206 away from the substrate 201. Then, during the arrangement of the electrodes 209, the first electrodes 291, penetrating the passivation layer 208 and being in electrical contact with the first doped conductive layer 203, are formed, and the second electrodes 292, penetrating the passivation layer 208 and being in electrical contact with the second doped conductive layer 206, are formed.

By forming the passivation layer 208, on the one hand, an optical path of incident light, to be emitted from the solar cell, in the solar cell can be improved, and the proportion of the incoming light in the incident light is reduced, and then the light absorption of the solar cell is improved. On the other hand, after the passivation layer 208 is formed, electrode paste may be printed on the passivation layer 208 and sintered during the preparation of the electrodes 209, to reduce the damage to the first doped conductive layer 203 and the second doped conductive layer 206 during the preparation of the electrodes 209, thereby reducing the probability of the electrodes paste burning through the first doped conductive layer 203 and the second doped conductive layer 206 and improving the reliability and yield of the solar cell.

In addition, the passivation layer 208 may be made of at least one of silicon oxide, aluminium oxide, silicon nitride or silicon oxynitride. The passivation layer 208 has a single layer structure or a multiple-layer structure. In a case that the passivation layer 208 has the multiple-layer structure, the layers are sequentially stacked in a direction perpendicular to the front surface of the substrate 201, the materials of different layers may be different, or the materials of some layers may be the same and different from the materials of other layers. For example, the multiple-layer structure may be a double-layer structure including a silicon nitride layer and an aluminium oxide layer which are stacked.

It should be understood that, the substrate 201, the first dielectric layer 202, the first doped conductive layer 203, the grooves 204, the second dielectric layer 205, the second doped conductive layer 206 and the doped layer 207 are respectively similar to the substrate 101, the first dielectric layer 102, the first doped conductive layer 103, the grooves 104, the second dielectric layer 105, the second doped conductive layer 106 and the doped layer 107 mentioned above, and description for them are not repeated here.

Figure 6:
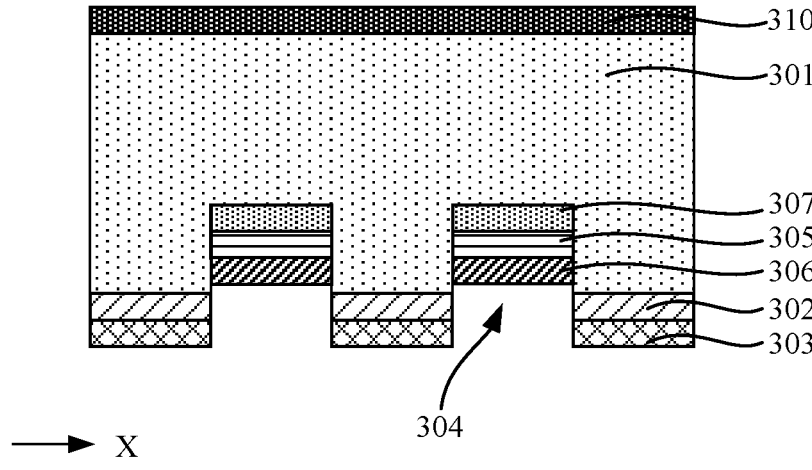
FIG. 6 is a schematic diagram of an overall structure of still another solar cell according to an embodiment of the present disclosure.

With reference to FIG. 2 and FIG. 6, FIG. 6 is a schematic diagram of an overall structure of a solar cell, where the X direction represents the first direction and the Y direction represents the direction perpendicular to the front surface of the substrate 301. In some embodiments, the solar cell may further include an antireflection layer 310 formed over the front surface of the substrate 301.

In the solar cell preparation process, in order to further improve the light absorption of the solar cell, the antireflection layer 310 may further be formed on the front surface of the substrate 301. The antireflection layer 310 can further reduce the reflection of the solar cell on the incident light irradiated to the front surface of the solar cell. In this way, the proportion of the incoming light entering the substrate 301 is significantly increased, thereby increasing the light absorption of the solar cell.

The antireflection layer 310 may be made of at least one of silicon oxide, aluminium oxide, silicon nitride or silicon oxynitride. The antireflection layer 310 has a single layer structure or a multiple-layer structure. In a case that the antireflection layer 310 has the multiple-layer structure, the layers are sequentially stacked in a direction perpendicular to the front surface of the substrate 301, the materials of different layers may be different, or the materials of some layers may be the same and different from the materials of other layers. For example, the multiple-layer structure may be a double-layer structure including a silicon nitride layer and a silicon oxynitride layer which are stacked.

The substrate 301, the first dielectric layer 302, the first doped conductive layer 303, the grooves 304, the second dielectric layer 305, the second doped conductive layer 306 and the doped layer 307 are respectively similar to the substrate 101, the first dielectric layer 102, the first doped conductive layer 103, the grooves 104, the second dielectric layer 105, the second doped conductive layer 106 and the doped layer 107 mentioned above, and description for them are not repeated here.

Figure 7:
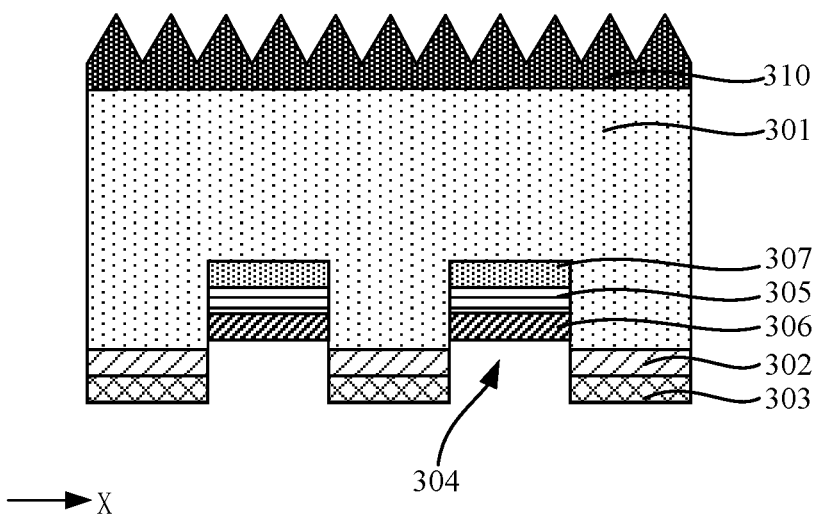
FIG. 7 is a schematic diagram of an overall structure of an additional solar cell according to another embodiment of the present disclosure.

With reference to FIG. 2 and FIG. 7, FIG. 7 is a schematic diagram of an overall structure of a solar cell, where the X direction represents the first direction. In some embodiments, a surface of the antireflection layer 310 away from the substrate 301 is a textured surface.

In the process of arranging the antireflection layer 310, the surface of the antireflection layer 310 away from the substrate 301 may be arranged as a textured surface. For example, an initial antireflection layer, with a surface away from the substrate 301 being a smooth surface, is firstly formed on the surface of the substrate 301, then the surface of the initial antireflection layer away from the substrate 301 is processed by the patterning or texturing process, to form the antireflection layer 310. The surface of the antireflection layer 310 away from the substrate 301 has multiple convex structures, so that the surface of the antireflection layer 310 away from the substrate 301 is a textured surface. The smooth surface refers to a surface with a surface roughness lower than a preset value, for example, the surface roughness is less than 50 nm or 200 nm.

The convex structure may be a pyramid structure, a pyramid-like structure or other pyramidal structures. The surface of the antireflection layer 310 away from the substrate 301 has multiple convex structures, the textured surface formed by the convex structures can further reduce the reflection of the antireflection layer 310 on the incident light, and further improve the light absorption of the solar cell.

In some embodiments, a surface of the antireflection layer 310 in contact with the substrate 301 is a textured surface.

In the solar cell preparation process, the antireflection layer 310 is usually formed on the front surface of the substrate 301 by the deposition process. In the case that the front surface of the substrate 301 is a smooth surface, the surface of the antireflection layer 310 in contact with the substrate 301 is also a smooth surface. In the case that the front surface of the substrate 301 is a textured surface, the surface of the antireflection layer 310 in contact with the substrate 301 is also a textured surface.

In the case that the front surface of the substrate 301 is arranged as a textured surface, that is, after the front surface of the substrate 301 is arranged as a micro-textured surface, the surface of the antireflection layer 310 facing towards the substrate 301 may also be arranged as a textured surface containing multiple convex structures. The substrate 301 and the antireflection layer 310 can effectively improve the optical path of the incident light in the solar cell and improve the light absorption of the solar cell, so as to improve the photoelectric conversion efficiency of the solar cell. The convex structure may be a pyramid structure, a pyramid-like structure or other pyramidal structures.

It should be noted that, the features in the above embodiments may exist in the solar cell alone. In the absence of technical conflicts, under the premise of not exceeding the invention concept of the embodiments of the present disclosure, the features in the embodiments may also be implemented in combination with each other, which is not describes in detail here.

In summary, in the solar cell is provided by the embodiments of the present disclosure, at the rear surface, the substrate is provided with a passivation contact structure formed by the first dielectric layer and the first doped conductive layer and a passivation contact structure formed by the second dielectric layer and the second doped conductive layer, so as to significantly reduce carrier recombination on the rear surface of the substrate, thus reducing a recombination current on the rear surface of the substrate. In this way, carrier recombination loss of the solar cell is reduced. The doped conductive layers include the first doped conductive layer and the second doped conductive layer with different doping types, so that all of the electrodes of the solar cell can be arranged on the rear surface of the solar cell, the influence of the electrodes, located on the front surface of the solar cell, on the light absorption of the cell are significantly reduced, and the light absorption of the solar cell is improved. The doped layer, with the doping type different from the doping types of the substrate and the second doped conductive layer, is arranged between the substrate and the second dielectric layer. An electric field is formed between the substrate and the doped layer and an electric field is formed between the doped layer and the second doped conductive layer, thereby improving an efficiency of a specific type of carriers in the substrate converging to a region aligned with the second doped conductive layer. In addition, a passivation effect of the substrate is improved and the open-circuit voltage of the solar cell is increased, the carrier recombination on the rear surface of the substrate is reduced, and the photoelectric conversion efficiency of the solar cell is significantly improved.

Figure 8:
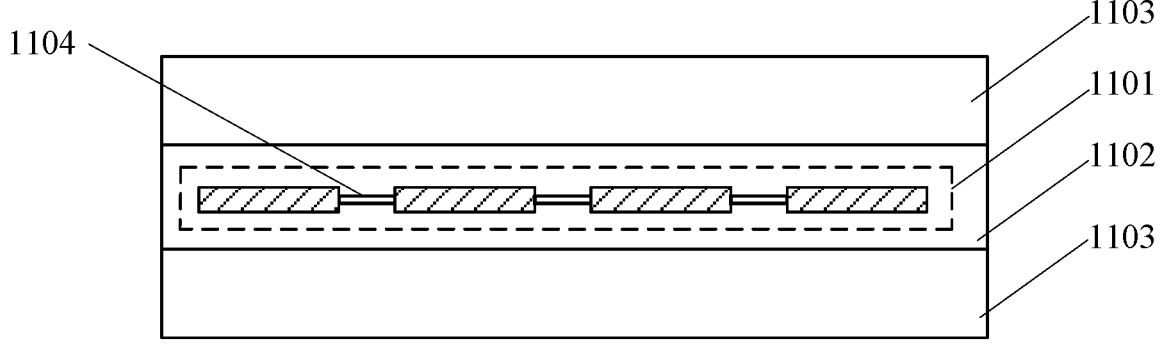
FIG. 8 is a schematic structural diagram of a photovoltaic module according to an embodiment of the present disclosure.

Accordingly, embodiments of the present disclosure further provide a photovoltaic module. As shown in FIG. 8, the photovoltaic module includes at least one cell string 1101 formed by connecting multiple solar cells described above or multiple cells prepared by the method described above; at least one encapsulation layer 1102 configured to cover surfaces of the at least one cell string 1101; and at least one cover plate 1103 configured to cover surfaces of the at least one encapsulation layer 1102 away from the at least one cell string 1101. The multiple solar cells are electrically connected in whole or in pieces to form multiple cell strings 1101 electrically connected in series and/or in parallel.

In some embodiments, the multiple cell strings 1101 may be electrically connected to each other by conductive strips 1104. The at least one encapsulation layer 1102 covers the front surface and the rear surface of the solar cell. Specifically, the at least one encapsulation layer 1102 may be an organic encapsulation adhesive film such as an ethylene-vinyl acetate copolymer (EVA) adhesive film, a polyethylene octene co-elastomer (POE) adhesive film, a polyethylene terephthalate (PET) adhesive film. In some embodiments, the at least one cover plate 1103 may be a glass cover plate, a plastic cover plate, or the like having a light transmitting function. The surface of the at least one cover plate 1103 facing towards the at least one encapsulation layer 1102 may be a textured surface, thereby increasing utilization of the incident light.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

Although the present disclosure is disclosed in the above embodiments, the present disclosure is not intended to limit the claims. Any person skilled in the art may make several possible changes and modifications without departing from the concept of the present disclosure, the changes and modifications do not depart from the spirit and scope of the present disclosure. Therefore, the protection scope of the present disclosure shall be subject to the scope defined in the claims of the present disclosure.

What is claimed is:

1. A solar cell, comprising:
   a substrate having a front surface and a rear surface opposite to the front surface;
   a first dielectric layer formed over the rear surface of the substrate;

a first doped conductive layer formed over a surface of the first dielectric layer away from the substrate, and doped with a first dopant element, wherein the substrate is doped with a second dopant element, one of the first dopant element and the second dopant element being a P-type dopant element and another of the first dopant element and the second dopant element being an N-type dopant element;

a plurality of grooves arranged at intervals in a first direction, penetrating the first doped conductive layer and the first dielectric layer, and extending into the substrate;

a second dielectric layer formed over bottom surfaces of the plurality of grooves;

a second doped conductive layer formed over a surface of the second dielectric layer away from the substrate, and doped with the second dopant element; and a doped layer aligned with the second doped conductive layer, located between the second dielectric layer and the substrate, and doped with the first dopant element.

2. The solar cell according to claim 1, wherein a ratio of a doping concentration of the first dopant element in the doped layer to a doping concentration of the first dopant element in the first doped conductive layer ranges from $1\times10^{-4}$ to $1\times10^{-3}$.

3. The solar cell according to claim 2, wherein the doping concentration of the first dopant element in the doped layer ranges from $1\times10^{14}/cm^3$ to $9\times10^{18}/cm^3$.

4. The solar cell according to claim 1, wherein in a direction perpendicular to the front surface of the substrate, a ratio of a thickness of the doped layer to a thickness of the substrate ranges from $5\times10^{-4}$ to $2\times10^{-3}$.

5. The solar cell according to claim 4, wherein in the direction perpendicular to the front surface of the substrate, the thickness of the doped layer ranges from 100 nm to 300 nm.

6. The solar cell according to claim 1, wherein in a direction perpendicular to the front surface of the substrate, an interval between a surface of the second doped conductive layer away from the substrate and a surface of the first doped conductive layer facing towards the substrate is less than or equal to 1 μm.

7. The solar cell according to claim 6, wherein in the direction perpendicular to the front surface of the substrate, the interval between the surface of the second doped conductive layer away from the substrate and the surface of the first doped conductive layer facing towards the substrate ranges from 50 nm to 300 nm.

8. The solar cell according to claim 1, further comprising a passivation layer and a plurality of electrodes, the passivation layer being formed over a surface of the first doped conductive layer away from the substrate and a surface of the second doped conductive layer away from the substrate, the plurality of electrodes including first electrodes and second electrodes arranged alternatingly, the first electrodes penetrating the passivation layer and being in electrical contact with the first doped conductive layer, and the second electrodes penetrating the passivation layer and being in electrical contact with the second doped conductive layer.

9. The solar cell according to claim 1, further comprising an antireflection layer formed over the front surface of the substrate.

10. The solar cell according to claim 9, wherein the antireflection layer has a textured surface away from the substrate.

11. The solar cell according to claim 9, wherein the antireflection layer has a textured surface in contact with the substrate.

12. The solar cell according to claim 1, wherein in the first direction, a ratio of a length of any portion of the second doped conductive layer to a length of any portion of the first doped conductive layer ranges from 0.2 to 1.

13. The solar cell according to claim 12, wherein in the first direction, the second doped conductive layer has a thickness in a range of 200 μm to 400 μm.

14. The solar cell according to claim 1, wherein the first doped conductive layer is not in contact with the second doped conductive layer.

15. The solar cell according to claim 1, wherein the doped layer and the second dielectric layer have a same length and width as the second doped conductive layer.

16. The solar cell according to claim 1, wherein the first dielectric layer has a same length and width as the first doped conductive layer.

17. The solar cell according to claim 1, wherein one of the first dopant element and the second dopant element is a P-type dopant element and another of the first dopant element and the second dopant element is an N-type dopant element.

18. The solar cell according to claim 1, wherein a doping concentration of the second dopant element in the second doped conductive layer is higher than a doping concentration of the second dopant element in the substrate.

19. The solar cell according to claim 1, wherein the doping concentration of the first dopant element in the first doped conductive layer ranges from $1\times10^{20}/cm^3$ to $6\times10^{20}/cm^3$.

20. A photovoltaic module, comprising:

at least one cell string formed by connecting a plurality of solar cells according to claim 1;

at least one encapsulation layer configured to cover surfaces of the at least one cell string; and at least one cover plate configured to cover surfaces of the at least one encapsulation layer away from the at least one cell string.

* * * * *